(12) United States Patent
Breems et al.

(10) Patent No.: US 10,014,878 B1
(45) Date of Patent: Jul. 3, 2018

(54) METASTABILITY COMPENSATION

(71) Applicant: NXP B.V., Eindhoven (NL)

(72) Inventors: Lucien Johannes Breems, Waalre (NL); Muhammed Bolatkale, Rijswijk (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/849,672

(22) Filed: Dec. 21, 2017

(30) Foreign Application Priority Data

Dec. 22, 2016 (EP) .................................. 16206388

(51) Int. Cl.
*H03M 1/06* (2006.01)
*H03M 3/00* (2006.01)

(52) U.S. Cl.
CPC ........... *H03M 3/352* (2013.01); *H03M 3/412* (2013.01); *H03M 3/464* (2013.01)

(58) Field of Classification Search
CPC ...... H03M 3/352; H03M 3/464; H03M 3/412; H03M 3/00; H03M 3/30; H03M 1/06; H03M 1/1023; H03M 1/203
USPC .................................................. 341/118, 143
See application file for complete search history.

(56) References Cited

U.S. PATENT DOCUMENTS

| | | | | |
|---|---|---|---|---|
| 5,153,593 A * | 10/1992 | Walden | ................. | H03M 3/354 341/143 |
| 7,224,757 B2 * | 5/2007 | Capofreddi | ........... | H03M 3/374 327/277 |
| 7,535,389 B1 * | 5/2009 | Teterwak | ............ | H03M 1/1042 341/118 |
| 8,319,674 B2 * | 11/2012 | Loeda | ..................... | H03M 3/37 341/143 |
| 8,564,462 B2 * | 10/2013 | Gomez | ................... | H03M 1/06 341/118 |
| 9,143,158 B2 | 9/2015 | Breems | | |
| 9,712,184 B2 | 7/2017 | Breems et al. | | |
| 2012/0062405 A1 * | 3/2012 | Loeda | ..................... | H03M 3/37 341/143 |
| 2015/0222289 A1 * | 8/2015 | Chen | ....................... | H03M 3/38 341/143 |

OTHER PUBLICATIONS

Srinivasan, V. et al. "A 20mW 61dB SNDR (60MHz BW) 1b 3rd-order continuous-time delta-sigma modulator clocked at 6GHz in 45nm CMOS", IEEE International Solid-State Circuits Conference, San Francisco, CA, pp. 158-160 (2012).

* cited by examiner

*Primary Examiner* — Jean B Jeanglaude
(74) *Attorney, Agent, or Firm* — Rajeev Madnawat

(57) ABSTRACT

A data processor is disclosed. The data processor includes a data processing module. The data processing modules includes an input for receiving an input signal, an output for providing a quantized output signal, a combining unit configured to combine a feedback signal from the output with the input signal and a quantizer configured to provide the quantized output signal based on the combined signal. The data processor further includes a correction module configured to receive the quantized output signal, generate a full-scale digital signal based on the quantized output signal, determine a metastability error in the full-scale digital signal and provide a compensated output signal based on the quantized output signal and the determined metastability error.

15 Claims, 5 Drawing Sheets

METASTABILITY COMPENSATION

CROSS-REFERENCE TO RELATED APPLICATIONS

This application claims the priority under 35 U.S.C. § 119 of European Patent application no. 16206388.7, filed on Dec. 22, 2016, the contents of which are incorporated by reference herein.

The present disclosure relates to a data processor having a metastability compensation module and in particular, although not exclusively, to a Sigma-Delta modulator comprising a metastability correction module.

According to a first aspect of the present disclosure there is provided a data processor comprising:
  a data processing module comprising:
    an input for receiving an input signal;
    an output for providing a quantized output signal;
    a combining unit configured to combine a feedback signal from the output with the input signal; and
    a quantizer configured to provide the quantized output signal based on the combined signal, and
  a correction module configured to:
    receive the quantized output signal;
    generate a full-scale digital signal based on the quantized output signal;
    determine a metastability error in the full-scale digital signal; and
    provide a compensated output signal based on the quantized output signal and the determined metastability error.

The correction module may provide downstream signal processing with respect to the data processing module. The combined signal received by the quantizer of the data processing module may be independent of the determined metastability error. The determined metastability error may not be an input signal for the feedback signal. The correction module may be outside of the data processing module. More particularly, the correction module may be outside of a feedback loop of the data processing module.

The correction module may comprise a full-scale quantizer. The full-scale quantizer may be configured to receive the output of the quantizer of the data processing module. The full-scale quantizer may be configured to provide a full-scale output representative of a digital signal with at least reduced metastability error. The full-scale quantizer may have the same resolution as, or shares reference levels with, the quantizer of the data processing module. The correction module may comprise a first digital-to-analogue converter configured to provide an analogue representation of the quantized output, wherein the analogue representation contains the metastability error. The correction module may comprise a second digital-to-analogue converter configured to provide an analogue representation of the full-scale output of the full-scale quantizer. The correction module may comprise an analogue combining circuit configured to provide an analogue representation of the metastability error based on the analogue representations of the quantized output and full-scale output. The correction module may comprise an analogue delay unit configured to delay signal propagation between the first digital-to-analogue converter and the analogue combining circuit in order to provide the analogue representations of the quantized output and full-scale output in phase at the analogue combining unit. At a given instant, a symbol of the analogue representation of the quantized output provided at an input of the analogue combining unit relates to a corresponding symbol of the analogue representation of the full-scale output at another input of the analogue combining unit. The correction module may comprise a metastability error quantizer configured to provide a digital representation of the metastability error based on the analogue representation of the metastability error. The correction module may comprise a digital combining circuit configured to provide a metastability corrected output signal based on the full-scale output and the digital representation of the metastability error.

The data processing module may be a Sigma-Delta modulator. The Sigma-Delta modulator may comprise a digital-to-analogue converter. The digital-to-analogue converter may be configured to receive the quantized output signal from the quantizer. The digital-to-analogue converter may be configured to provide an analogue feedback signal to the combining unit.

Other types of data processor include successive approximation register and pipelined registers, for example. The first and second digital-to-analogue converters may have the same gain as the digital-to-analogue converter of the Sigma-Delta modulator. The metastability error quantizer may have the same resolution as, or shares at least one reference level with, the quantizer of the data processing module. The quantizer of the data processing module, full-scale quantizer, and metastability error quantizer may receive a common clock input. The quantized output signal and the compensated output signal may be multi-bit digital domain signals.

According to a further aspect of the present disclosure there is provided a method of operating a data processor. The method comprises:
  receiving an input signal;
  providing, in a first clock cycle, a quantized output signal based on the input signal;
  combine a feedback signal based on the quantized output signal with the input signal;
  providing, in subsequent clock cycles, the quantized output signal based on the combined signal;
  generating a full-scale digital signal based on the quantized output signal;
  determining a metastability error in the full-scale digital signal; and
  providing a compensated output signal based on the quantized output signal and the determined metastability error.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

One of more embodiments will now be described by way of example only with reference to the accompanying drawings in which.

Continuous-time Sigma-Delta ADCs contains one or multiple Sigma-Delta modulators. A Sigma-Delta modulator is an example of a data processor that has a feedback loop containing a loop filter, a quantizer, and a feedback DAC(s). The function of the quantizer is sampling and quantization. Its input signal is continuous in time domain and continuous in voltage (or current) domain, i.e. continuous-time continuous-value (analogue signal). The output signal of a Sigma-Delta modulator should be discrete in the time domain and discrete in voltage domain, that is, discrete-time discrete-value (digital signal). The function of the feedback DAC is a zero-order hold, which converts the digital signal back to an analogue signal for feeding back as a component to an input of the Sigma-Delta modulator.

Figure 1:
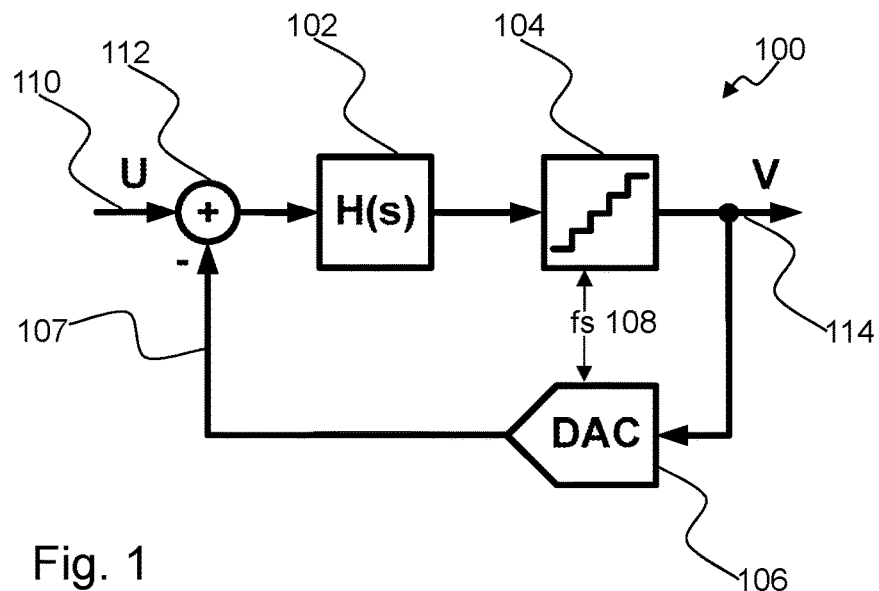
FIG. 1 shows a schematic block diagram of a sigma-delta modulator.

FIG. 1 illustrates a block diagram of a sigma-delta modulator 100. The modulator 100 is an example of a data processor with a feedback system. The modulator 100 consists of an adder 112, a loop filter (H(s)) 102, a quantizer or analogue-to-digital converter (ADC) 104 and a digital-to-analogue converter (DAC) 108. The DAC 108 provides a feedback path.

An input U 110 is coupled to a positive input of the adder 112. The output of the adder 112 is coupled to an input of the loop filter (H(s)) 102. The output of the loop filter (H(s)) 102 is coupled to an input of the ADC 104. An output of the ADC 104 is the output V 114 of the modulator 100.

In order to provide the feedback loop, the output of the quantizer 104 is also coupled to an input of the DAC 106. The output of the DAC 106 is coupled to a negative input of the adder 112 to provide a feedback signal 107. In this way, the DAC 108 is in the feedback path.

The quantizer 104 and the DAC 106 are both clocked by a clock signal 108 that has a sampling frequency fs. Typically the sampling frequency may be higher than the minimum required Nyquist rate such that the modulator 100 is oversampled.

Due to the presence of feedback, the loop filter 102, and the fact that a sigma-delta modulator 100 is usually highly oversampled, the quantization error of the modulator 100 in the signal band of interest is shaped (approximately) according to the inverse of the loop filter 102 characteristic. Also, the quantization error of the quantizer ADC 104 is suppressed in the frequency region where the gain of the loop filter 102 is high. At frequencies where the gain of the loop filter 102 decreases, the quantization noise increases. However, a digital decimation filter (not shown) can be placed at the output of the sigma-delta modulator 100 to filter out the out-of-band quantization noise.

However, as a sigma-delta modulator 100 is a feedback system, it can become increasingly difficult to keep the modulator 100 stable at high sampling frequencies. This may be due to parasitic poles and any additional delays in the circuit, for example caused by the quantizer 104 and/or DAC 106. Another aspect of the sigma-delta modulator 100 (and also other type of A/D converters) is that metastability of the quantizer 104 can cause errors in the system, particularly for very small input signals to the quantizer 104, which can degrade performance, as discussed below with reference to FIGS. 2 to 4.

The quantizer 104 may be a particularly important block in a sigma-delta modulator 100 for several reasons. It needs to provide enough gain to enable a digital decision to be made based on a very small signal received from the loop filter 102. Depending on the resolution of the sigma-delta modulator 100 and the specified system bit error rate (BER), the required gain of the quantizer 104 can be for example of the order of $10^7$-$10^8$. However, the delay of the quantizer 104 during the decision making process has a direct impact on the stability of the sigma-delta loop. For a continuous-time Sigma-Delta ADC, the time taken by the quantizer 105 to perform the steps of sampling the input and providing output is limited because the regeneration time is part of the total loop delay for the feedback loop, as shown in FIG. 1, and the total loop delay is normally no more than one sampling clock period. The time from the quantizer 104 sampling its input signal, to the next block (feedback DAC 106 or its driving circuits) sampling the output V 114 of the quantizer 104, is defined as the regeneration time for the quantizer. The regeneration time of the quantizer is limited, and normally less than one sampling clock period. Indeed, for very high speed sigma-delta modulators (for example at 10 GHZ to 20 GHz), the maximum allowable delay time of the quantizer 104 may be only 50 ps. The achievable gain of the quantizer 104 is directly related to its available time budget, as discussed with regard to equations 1 and 2 and FIG. 2 below.

For an ideal quantizer, an output value provided by the quantizer should always conform to one of a number of permissible, or legal, output values. For simplicity, the example below is described with reference to a 1-bit quantizer. The legal output values in this example are 1 and −1. A transfer function of the ideal 1-bit quantizer is:

$$V_{out} = \begin{cases} 1, & \text{if } V_{in} \geq 0 \\ -1, & \text{if } V_{in} < 0 \end{cases} \qquad \text{Eq. 1}$$

To implement a quantizer with solid-state circuitry, a latch may be used to sense an input signal and to provide an output signal as a logical value (1 or −1). Legal logical values that are at the saturated levels (1 or −1) may be referred to as full-scale values.

Figure 2:
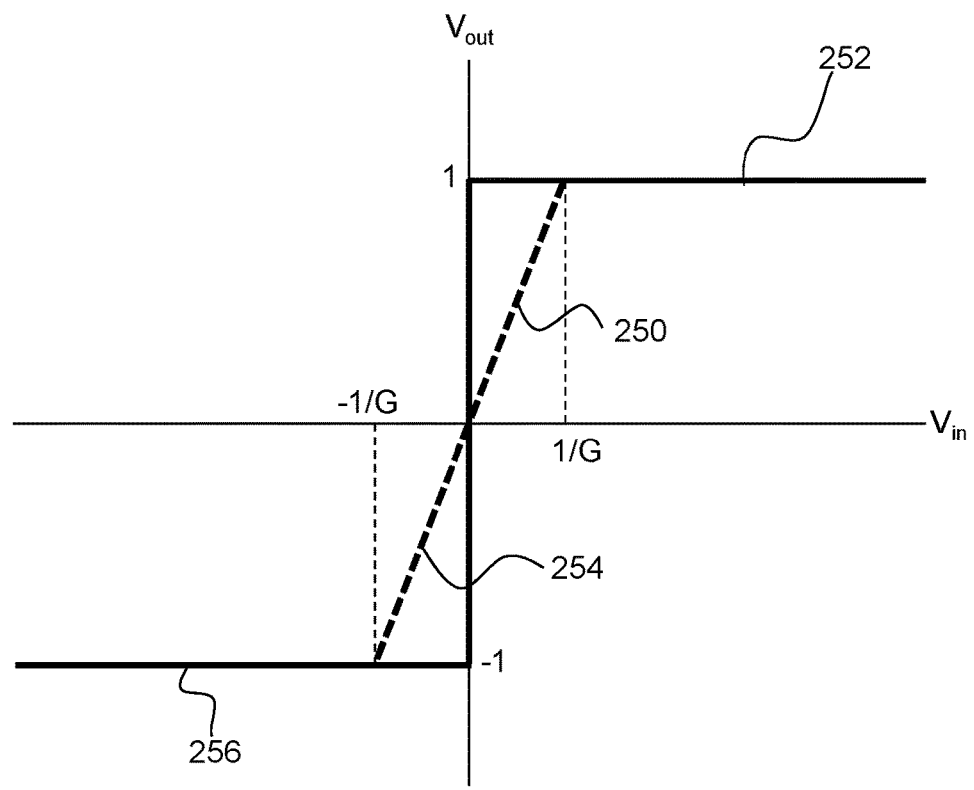
FIG. 2 shows output characteristic of a 1-bit quantizer with a limited regeneration time.

FIG. 2 shows a profile of an output voltage $V_{out}$ against an input voltage $V_{in}$ for a 1-bit quantizer with a limited regeneration time. Limiting the regeneration time has the effect that the gain of the latch is also constrained. When an input of a quantizer is very small (close to 0), the output of the quantizer may not reach a full-scale value (legal output 1 or −1), but instead fall at a value between the legal values (e.g. 0.39 or −0.92). The transfer function of the quantizer with limited gain may be express as (assuming the quantizer has a linear gain model):

$$V_{out} = \begin{cases} 1, & \text{if} \quad V_{in} > 1/G \\ G \cdot V_{in}, & \text{if} \quad -1/G \leq V_{in} \leq 1/G \\ -1, & \text{if} \quad V_{in} < -1/G \end{cases} \quad \text{Eq. 2}$$

FIG. 2 shows a profile of an output voltage $V_{out}$ against an input voltage $V_{in}$ for a 1-bit quantizer with a limited regeneration time and having the transfer function of Equation 2.

For positive values of the input voltage $V_{in}$, the output voltage $V_{out}$ increases linearly in a region 250 between 0 V and a voltage representing logical 1 (a full-scale value) as the input voltage $V_{in}$ varies between 0 V and one over the gain of the latch (1/G). Where the input $V_{in}$ is greater than one over the gain of the latch (1/G), the output voltage $V_{out}$ is saturated in a region 252 at the voltage representing logical 1. Similarly, for negative values of the input voltage $V_{in}$, the output voltage $V_{out}$ increases linearly in a region 254 between 0 V and a voltage representing logical −1 (a full-scale value) as the input voltage $V_{in}$ varies between 0 V and minus one over the gain of the latch (−1/G). Where the input voltage $V_{in}$ is more negative than minus one over the gain of the latch (−1/G), the output voltage $V_{out}$ is saturated 256 at the voltage representing logical −1.

As discussed previously with regard to FIG. 1, the quantizer output V 114 is the input of the feedback DAC 106. In practice, even if the sampled quantizer output is not full-scale, but close to full-scale, the DAC 106 can further resolve it and deliver full-scale output in the feedback path to the adder 112. This effect may be referred to as the gain ($G_{DAC}$) of the DAC 106. The gain ($G_{DAC}$) of the DAC 106 is also limited, and may be substantially lower than the gain of the quantizer ($G_q$). A total loop gain ($G_{loop}$) of the sigma-delta modulator can be considered to be the quantizer gain ($G_q$) multiplied by DAC gain ($G_{DAC}$):

$$G_{loop} = G_q \cdot G_{DAC} \quad \text{Eq. 3}$$

If the sampled quantizer input is very small ($V_{in} < 1/G_{loop}$), the sampled quantizer output is not full-scale. The (not full-scale) output 114 of the Sigma-Delta modulator 100 is typically provided to external digital processing circuitry (not shown). The thresholding and gain applied by the digital processing circuitry has the effect of forcing the output 114 to a full-scale value. The output of the Sigma-Delta modulator therefore appears to take a valid digital value from the perspective of down-stream digital electronics. However, for the feedback loop within the Sigma-Delta modulator 100, the output of the DAC 106 may also not take a full-scale value (−1 or 1), but instead fall at some number between −1 and 1, even after considering the gain of the DAC 106.

The metastability error, $E_{meta}$, is defined as the difference between the actual output V 114 (e.g. −0.92) of the Sigma-Delta modulator 100 and a corresponding full-scale value V' (e.g. −1):

$$E_{meta} = V' - V \quad \text{Eq. 4}$$

Figure 3:
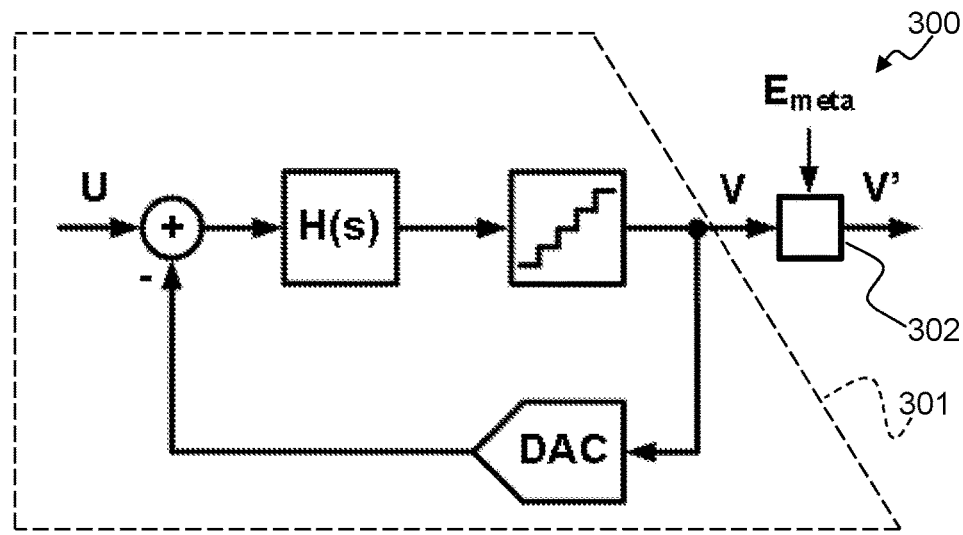
FIG. 3 shows a schematic block diagram of a continuous-time Sigma-Delta ADC with a metastability error.

FIG. 3 illustrates a schematic block diagram of a data processor 300. The data processor 300 comprises a Sigma-Delta modulator 301 similar to that described previously with reference to FIG. 1. An output V of the Sigma-Delta modulator 301 is provided to downstream digital processing circuitry 302. The metastability error $E_{meta}$ may be considered to be introduced by the circuitry 302 when the output V of the DAC is forced to a full-scale value V' by the circuitry 302, as shown in FIG. 3. The magnitude of the metastability error may be referred to generally as the metastability error.

Figure 4A:
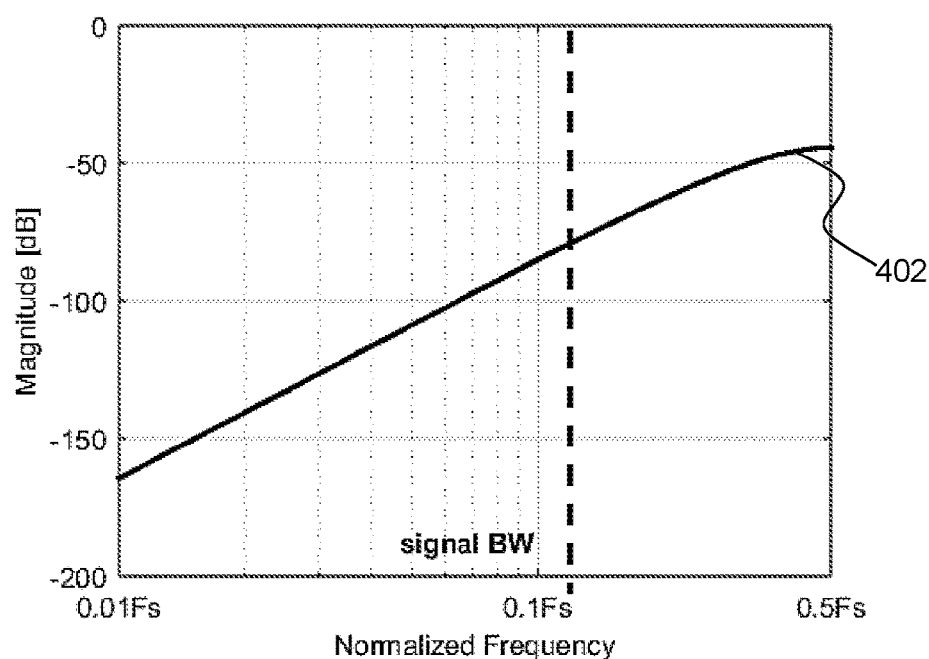
FIG. 4a shows a log magnitude against normalized frequency profile of an ideal transfer function of a sigma-delta modulator.

FIG. 4a shows a magnitude against normalized frequency profile of an ideal transfer function 402 of a sigma-delta modulator. The normalised frequency is provided on a logarithmic scale in terms of the sampling frequency fs of the Sigma-Delta modulator.

Figure 4B:
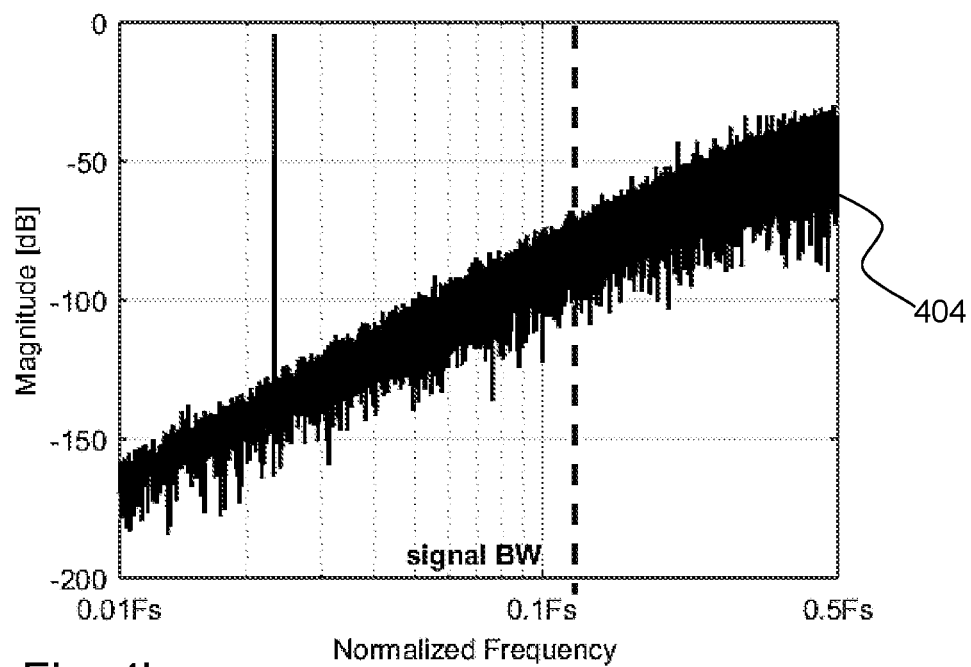
FIG. 4b shows a log magnitude against normalized frequency profile at the output of a model sigma-delta modulator without metastability error.

FIG. 4b shows a magnitude against normalized frequency profile at the output of a model sigma-delta modulator (without metastability error). The simulated output spectrum 404 comprises $2^{17}$ samples and is provided by a 4th order Sigma-Delta modulator with an ideal 9-level quantizer. At low frequencies, the quantization noise is deeply suppressed by the loop filter of the Sigma-Delta modulator. The output 404 of the Sigma-Delta modulator closely matches the normal transfer function and increases roughly exponentially (linearly as shown on the linear/log scale) from about −170 dB at 0.01 fs to about −50 dB at 0.5 fs. The quantization noise has an 80 dB/dec slope.

Figure 4C:
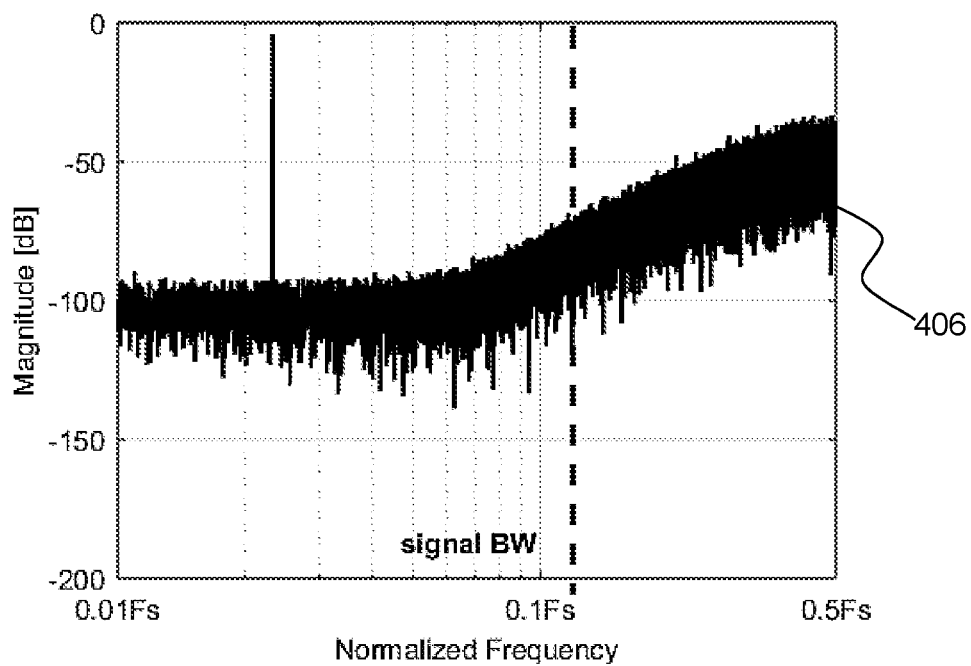
FIG. 4c shows a log magnitude against normalized frequency profile at the output of a model sigma-delta modulator with metastability error.

FIG. 4c shows a magnitude against log normalized frequency profile at the output of a model sigma-delta modulator with metastability error. The total loop quantizer gain $G_{loop} = 80$ dB in this example. In this case, metastability error happens with certain probability. The metastability error can be modelled as white noise, and it is not shaped. The output spectrum 406 has flat, increased in-band noise at a level of about −100 dB below 0.05 fs (marked with a dashed vertical line). The presence of metastability error therefore reduces the signal-to-noise ratio and dynamic range of the Sigma-Delta ADC. For some systems, the introduction of metastability error may be particularly undesirable in that it produces a noticeable effect on the output signal. For example, metastability in AM and FM radio applications can result in an audible 'click' tone in the output signal.

Sigma-Delta ADC is one example of a data processing module comprising: an input for receiving an input signal; an output for providing a quantized output signal; a combining unit configured to combine a feedback signal from the output with the input signal; and a quantizer configured to provide the quantized output signal based on the combined signal. Other examples of data processing modules that have similar features, and also potentially suffer from issues to do with metastability error, include successive approximation registers and pipelined registers, for example.

Figure 5:
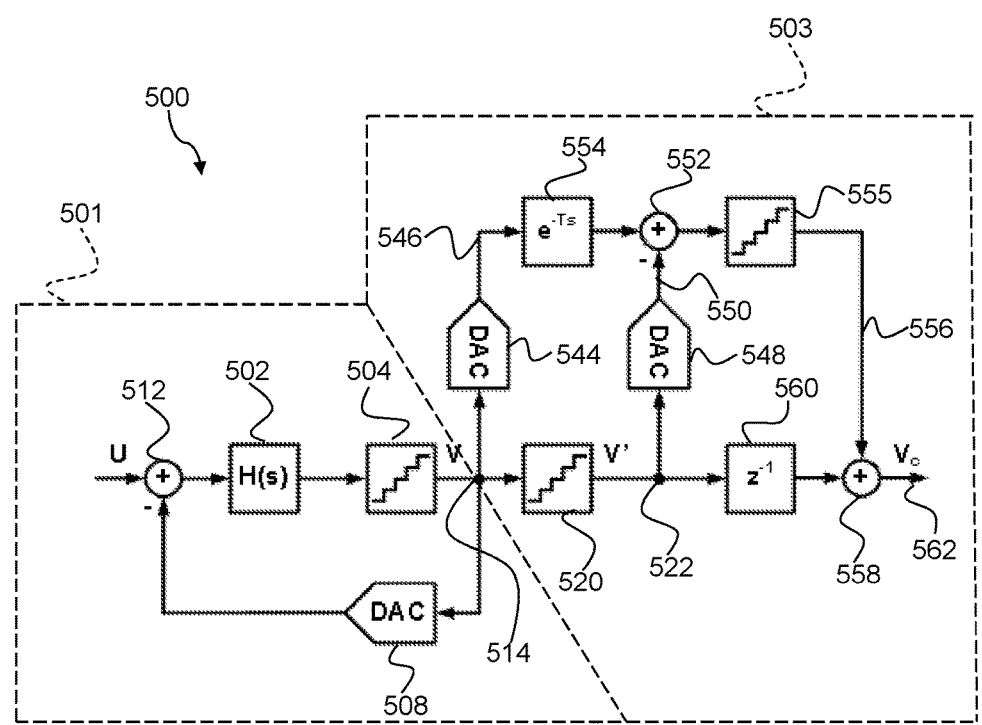
FIG. 5 shows a schematic block diagram of a continuous-time Sigma-Delta ADC with a metastability error compensation circuit.

FIG. 5 illustrates a data processor 500 comprising a data processing module 501 and an error correction module 503. The data processing module 501 has the same configuration as the Sigma-Delta modulator described previously with reference to FIG. 1. As such, the data processing module 501 comprises an adder 512, a loop filter 502, a quantizer or analogue-to-digital convertor (ADC) 504 and a digital-to-analogue (DAC) 508. An output V 514 is provided by the quantizer 504 as the output of the quantizer module 501. The output V 514 may be a single voltage representative of a single bit or it may be a plurality of voltages representative of a respective plurality of bits, depending on the configuration of the quantizer 504. For example, the quantizer 504 may be an m-bit quantizer (m>2) comprising m−1 pre-amplifiers and m−1 latches, as is known in the art. The pre-amplifiers compare the input of the quantizer 504 with a series of references (which may be reference voltages or reference currents, for example). The latches act on the respective outputs of the pre-amplifiers to provide output signals that represent digital values of the respective m-bits. The output V 514 may comprise a metastability error, where the output does not conform to a full-scale value due to the input conditions of the quantizer 504, during at least some clock cycles.

The correction module 503 is provided outside of the feedback loop of the data processing module 501. The correction model 503 therefore does not affect the operation of the data processing module 501. Instead, the quantization model 503 provides correction for metastability error in the output V 514 of the data processing module 501 that is applied, in subsequent clock cycles, to the product at the output V 514 of the data processing module 501. By using subsequent clock cycles, additional settling time may be provided in order for the metastability error to be removed from the output V 522 of the quantizer 520 without affecting the regeneration time of the quantizer 504. The metastability corrected output does not need to be fed back in the data processing module 501. The combined signal received by the quantizer 504 of the data processing module 501 may therefore be considered to be independent of the determined metastability error. In this way, the performance of the processing model 500 may be improved in respect of its signal-to-noise ratio and noise transfer function without detriment to the stability of the data processing module 501.

The correction model 503 comprises a full-scale quantizer 520. The full-scale quantizer 520 may be functionally similar to the quantizer 504 of the data processing module 501. That is, the full-scale quantizer 520 may have the same resolution (number of quantization levels) as the quantizer 504 of the data processing module 501.

The full-scale quantizer 520 receives the output V 514 of the quantizer 504 at its input and provides a digital, full-scale output V' 522 at its output. By passing the output V 514 through the further quantizer, the output V 514 is effectively forced to a full-scale value (a saturated, legal logic value). The reason for this is that the full-scale quantizer 520 has further gain, which may be the same gain as the quantizer 504, and so the probability of the "full-scale" output V' 522 not taking a full-scale value is reduced by a factor of the gain. It will be appreciated that the term "full-scale" quantizer 520 refers to the objective of the quantizer and that there may be a non-zero probability that the output of the "full-scale" quantizer 520 does not fall at a full-scale value.

In some examples, the full-scale quantizer 520 may differ from the quantizer 504 of the data processing module 501 in that pre-amplifiers may be omitted in the full-scale quantizer 520. That is, the full-scale quantizer 520 might comprise only M-1 latches. Reference values for the latches of the full-scale quantizer 520 may be taken to be the same as those for the quantizer 504 of the data processing module 501. In this case, every latch of the full-scale quantizer 520 directly samples the output of a corresponding latch of the quantizer 504 of the quantization model. Regeneration is performed by the full-scale quantizer 520 from these latched values.

In further examples, the full-scale quantizer 520 may comprise fewer latches than the quantizer 504 of the data processing module 501. The latch(es) of the quantizer 504 with output that may contain a quantization error are determined dynamically and only the output of those latches are re-quantized by the full-scale quantizer 520, similar to the approach used in a tracking quantizer.

Both the output V 514 of the quantizer 504 of the data processing module 501 and the output V' 522 of the full-scale quantizer 520 are converted to analogue values within the correction model 503. A first correction DAC 544 receives the output V 514 of the quantizer 504 and provides an analogue output 546. A second correction DAC 548 receives the full-scale output V' 522 of the full-scale quantizer 520 and provides a full-scale analogue output 550. An analogue correction adder 552, which is an example of an analogue combining circuit, receives the analogue output 546 and the analogue full-scale output 550. An analogue propagation delay 554 is provided between the output of the first correction DAC 544 and the analogue correction adder 552. The analogue propagation delay 554 is configured to delay the analogue signal on the signal path from the first correction DAC 544 by the same extent that the signal passing on the signal path through the full-scale quantizer 520 is delayed, that is, by the regeneration time of the full-scale quantizer 520. In this way, the analogue output 546 and the analogue full-scale output 550 are provided in phase to the analogue correction adder 552. The analogue correction adder 552 subtracts the analogue full-scale output 550 from the analogue output 546. An output of the analogue correction adder 552 provides an analogue metastability error, which is the majority part of the metastability error of the Sigma-Delta modulator, because the analogue correction adder 552 has effectively subtracted the full-scale analogue representation which represents the correct, legal value from the analogue representation of the output 546 that contains the metastability error. A metastability quantizer 555 receives the output of the analogue correction adder 552 and provides a quantized metastability error 556 at its output. The quantized metastability error 556 is provided to a digital correction adder 558. The digital correction adder 558 also receives the full-scale output V' 522 from the full-scale quantizer 520. The full-scale output V' 522 is subject to a digital propagation delay 560 between the full-scale quantizer 520 and the digital correction adder 558. The digital propagation delay 560 is configured to provide the same delay to the full-scale output V' 522 that travels directly to the digital correction adder 558 as the delay incurred by the full-scale output V' 522 travelling the longer signal path (through the second correction DAC 548, the analogue correction adder 552 and the metastability quantizer 555) so that the signals are added in phase at the digital correction adder 558. The digital correction adder 558 provides a metastability corrected output V, 562. The provision of a metastability corrected output enables presence the signal-to-noise ratio and dynamic range of the Sigma-Delta ADC to be improved while leaving the stability of the feedback loop unaffected because the correction is made downstream of the feedback loop of the quantizer module 501.

A gain compensation unit (not shown) may be provided following the analogue correction adder 552 or metastability quantizer 555 in order to compensate for a mismatch in the gain along the signal paths that lead into the analogue correction adder 552. Such a gain mismatch may be caused by a difference in the gain of the second correction DAC 544, compared to the first correction DAC 548 and analogue propagation delay 554.

The first and second correction DACs 544, 548 may have the same gain as one another. The first and second DACs 544, 548 may also have the same gain as the DAC 508 of the quantizer module 501.

In a modified example, the analogue correction adder 552 may be configured to subtract the analogue output 546 (subject to the analogue propagation delay 554) from the analogue full-scale output 550. In this case, the output of the analogue correction adder 552 is the negative value of the metastability error. The digital correction adder 558 in such an example may therefore simply add the quantized negative value of the metastability error to the digital, full-scale output 522 (subject to the digital propagation delay 560). In this way, the metastability error in the Sigma-Delta loop can be re-generated and sampled out of the Sigma-Delta loop, quantized and compensated in digital domain.

Figure 6:
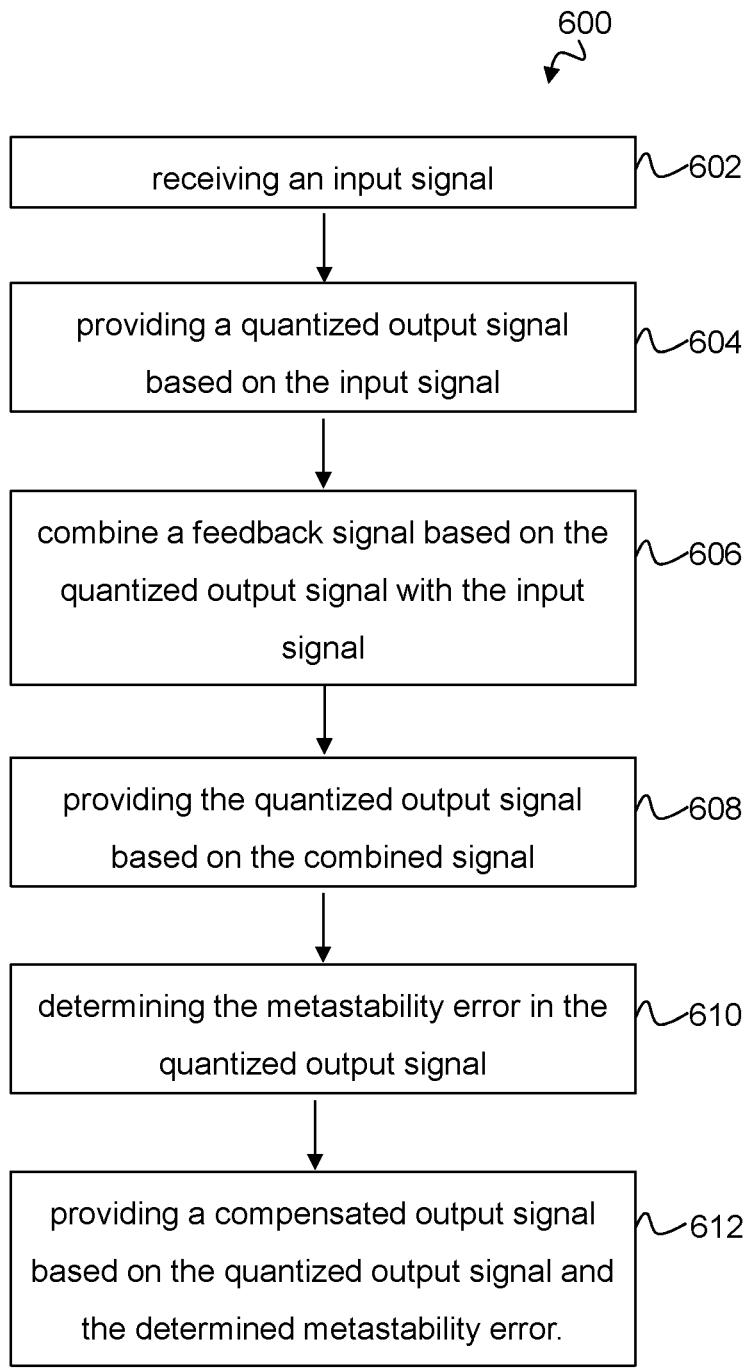
FIG. 6 shows a method of operating a data processor.

FIG. 6 illustrates a method 600 that may be performed using, for example, the data processor of FIG. 5. The method 600 comprises receiving 602 an input signal. In a first clock cycle, a quantized output signal is provided 604 based on the input signal. A feedback signal based on the quantized output signal is combined 606 with the input signal. In subsequent clock cycles, the quantized output signal is provided 608 based on the combined signal generated for an earlier clock cycle. The quantized output signal based on the combined feedback signal comprises a metastability error in at least some clock cycles. The metastability error in the quantized output signal is determined 610 and a compensated output signal is provided 612 based on the quantized output signal and the determined metastability error.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services.

These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A data processor comprising:
 a data processing module comprising:
  an input for receiving an input signal;
  an output for providing a quantized output signal;
  a combining unit configured to combine a feedback signal from the output with the input signal; and
  a quantizer configured to provide the quantized output signal based on the combined signal, and
 a correction module configured to:
  receive the quantized output signal;
  generate a full-scale digital signal based on the quantized output signal;
  determine a metastability error in the full-scale digital signal; and
  provide a compensated output signal based on the quantized output signal and the determined metastability error.

2. The data processor of claim 1, wherein the correction module provides downstream signal processing with respect to the data processing module.

3. The data processor of claim 1, wherein the combined signal received by the quantizer of the data processing module is independent of the determined metastability error.

4. The data processor of claim 1, wherein the correction module comprises a full-scale quantizer, the full-scale quantizer is configured to receive the output of the quantizer of the data processing module and to provide a full-scale output representative of a digital signal with at least reduced metastability error.

5. The data processor of claim 4, wherein the full-scale quantizer has the same resolution as, or shares reference levels with, the quantizer of the data processing module.

6. The data processor of claim 4, wherein the correction module comprises:
 a first digital-to-analogue converter configured to provide an analogue representation of the quantized output;
 a second digital-to-analogue converter configured to provide an analogue representation of the full-scale output of the full-scale quantizer; and
 an analogue combining circuit configured to provide an analogue representation of the metastability error based on the analogue representations of the quantized output and full-scale output.

7. The data processor of claim 6, wherein the correction module comprises an analogue delay unit configured to delay signal propagation between the first digital-to-analogue converter and the analogue combining circuit in order to provide the analogue representations of the quantized output and full-scale output in phase at the analogue combining unit.

8. The data processor of claim 7, wherein the correction module comprises:
- a metastability error quantizer configured to provide a digital representation of the metastability error based on the analogue representation of the metastability error;
- a digital combining circuit configured to provide a metastability corrected output signal based on the full-scale output and the digital representation of the metastability error.

9. The data processor of claim 6, wherein the data processing module is a Sigma-Delta modulator and further comprises a digital-to-analogue converter, wherein the digital-to-analogue converter is configured to receive the quantized output signal from the quantizer and provide an analogue feedback signal to the combining unit.

10. The data processor of claim 9, wherein the first and second digital-to-analogue converters have the same gain as the digital-to-analogue converter of the Sigma-Delta modulator.

11. The data processor of claim 8, wherein the metastability error quantizer has the same resolution as, or shares at least one reference level with, the quantizer of the data processing module.

12. The data processor of claim 8, wherein the quantizer of the data processing module, full-scale quantizer, and metastability error quantizer receive a common clock input.

13. The data processor of claim 1, wherein the quantized output signal and the compensated output signal are multi-bit digital domain signals.

14. The data processor of claim 1, wherein the correction module is outside of the data processing module.

15. A method of operating a data processor, the method comprising:
- receiving an input signal;
- providing, in a first clock cycle, a quantized output signal based on the input signal;
- combine a feedback signal based on the quantized output signal with the input signal;
- providing, in subsequent clock cycles, the quantized output signal based on the combined signal;
- generating a full-scale digital signal based on the quantized output signal;
- determining a metastability error in the full-scale digital signal; and
- providing a compensated output signal based on the quantized output signal and the determined metastability error.

* * * * *